United States Patent [19]
Kohno et al.

[11] Patent Number: 5,108,986
[45] Date of Patent: Apr. 28, 1992

[54] SUBSTITUTED YIBA₂CU₃ OXIDE SUPERCONDUCTOR

[75] Inventors: Osamu Kohno; Yoshimitsu Ikeno; Nobuyuki Sadakata; Masaru Sugimoto; Mikio Nakagawa; Shin'ya Aoki, all of Tokyo, Japan

[73] Assignee: Fujikura Ltd., Tokyo, Japan

[21] Appl. No.: 566,317

[22] Filed: Aug. 13, 1990

Related U.S. Application Data

[63] Continuation of Ser. No. 178,223, Apr. 6, 1988, abandoned.

[30] Foreign Application Priority Data

Apr. 7, 1987 [JP] Japan .................. 62-84983
Jul. 23, 1987 [JP] Japan .................. 62-184235
Jul. 23, 1987 [JP] Japan .................. 62-184236

[51] Int. Cl.⁵ .......................................... H01B 12/00
[52] U.S. Cl. .................................. 505/1; 505/780; 505/781; 252/521
[58] Field of Search .................. 505/1, 780, 781; 252/521

[56] References Cited

FOREIGN PATENT DOCUMENTS 277749 of 0000 European Pat. Off.
280812 of 0000 European Pat. Off.
0283620 10/1987 European Pat. Off.
0280812 11/1987 European Pat. Off.

OTHER PUBLICATIONS

Ovshinsky et al., "Superconductivity at 155K", *Phys. Rev. Lett.* vol. 58, No. 24, Jun. 15, 1987, pp. 2579-2581.
Hikami et al. *Japanese Journal of Applied Physics* vol. 26 No. 4 Apr. 1987 pp. L347-L348.
Wu et al. *Extended Abstracts High Temperature Superconductors* (Proceedings of Symposium S. Materials Research Society) Apr. 1987 pp. 69-71.
Murphy et al. *Physical Review Letters* vol. 58 No. 18 May 1987 pp. 1888-1890.
Tsurumi, et al. *J. Journal Applied Phys.* vol. 26 No. 5 May 1987 pp. L704-L705.
Ishida, *J. Journal Applied Physics.* vol. 26 No. 8 Aug. 1987 pp. L1294-L1295.
Hosoya et al. *Jpn. J. Applied Physics* vol. 26 No. 4 Apr. 1987 pp. L325-L326.
Kishio et al. *Jpn. J. Applied Physics* vol. 26 No. 4 Apr. 1987 pp. L391-L393.
Tonauki et al. *Jpn. J. Applied Physics* vol. 26 No. 4 Apr. 1987 pp. L519-L520.
Saito et al. *Jpn. J. Applied Physics* vol. 26 No. 5 May 1987 pp. L834-L835.
Felner, I. *Solid State Communications* vol. 62 No. 12 pp. 791-794 1987.
Bourne, L. C. et al. *Physics Letters A* vol. 123 No. 1 Jul. 1987 pp. 34-36.
Rao et al. *Current Science* vol. 56 No. 2 Jan. 1987 pp. 47-49.
McKinnon et al. *Extended Abstracts High Temperature Superconductors* (Proceedings of Symposium S. Materials Research Society) Apr. 1987 pp. 185-187.
Politis et al. *Extended Abstracts High Temperature Superconductors* (Proceedings of Symposium S Materials Research Soceity) 4/187 pp. 141-144.
Saito et al. *Jpn. J. Applied Physics* vol. 26 No. 3 Mar. 1987 pp. L223-L224.
Material Research Society Symposium Proceedings, vol. 99 (1989) pp. 293-296, Sadakata, et al., "Fabrication and Superconducting Properties of High $T_c$ Oxide Wire".
Materials Research Society International Symposium Proceedings, vol. 6 (1989) pp. 169-173, Ikeno, Y. et al., "Characterization and Superconductting Properties of Y-Ba-Cu-) Wire".
Physica B 155 (1989) 164-166, Ikenu, Y. et al., "High Field Properties and Characteristics of Oxide Superconductors".

(List continued on next page.)

*Primary Examiner*—Paul Lieberman
*Assistant Examiner*—Bradley A. Swope
*Attorney, Agent, or Firm*—Oblon, Spivak, McClelland, Maier & Neustadt

[57] ABSTRACT

The invention relates to a superconductor manufacturing method and a superconductor manufactured by the method. More particularly, the invention is concerned wih an oxide superconductor of lamellar perovskite type and a method of manufacturing the same having extemely high critical temperature and critical current density as compared witn conventional alloy superconductors or intermetallic compound superconductos. The superconductor is expressed by $$A\text{-}B\text{-}Cu\text{-}O$$

where

A represents at least one of elements of the group IIIa in the periodic table; and
B represents at least one of elements of the group IIa in the periodic table, wherein at least one A and B consists of two elements belonging to the same group.

The superconductor is manufactured by the steps of:
(a) mixing powder of a compound containing at least one of elements of the group IIIa in the periodic table, powder of a compound containing at least one of elements of the group IIa in the periodic table, powder of a compound containing a homologous element of at least one of elements of the groups IIIa and IIa in the periodic table, and powder of copper oxide with each other in such a manner that a ratio in number of atoms among the at least one element of the group IIIa, the at least one element of the group IIa, Cu and O is brought to (0.1 to 2.0) : (0.1 to 3.0) : 1 : (1 to 4), to obtain raw material powder; and
(b) sintering the raw material powder at a temperature in a range of from 800 to 1100 degrees C for 1 to 100 hours within an atmosphere in which oxygen concentration is at least 50%.

5 Claims, No Drawings

OTHER PUBLICATIONS

Physica 148B (1987) 429–431, Kohno, O et al, "Characteristics of High-Tc Oxide Wire".

Japanese Journal of Applied Physics, vol. 27, No. 1 (1988) pp. L77–L79, Kohno, O. et al, "High Critical Current Density of Y-Ba-Cu Oxide Wire without a Metal Sheath".

Japanese Journal of Applied Physics, vol. 26, No. 10 (1987), pp. 1653–1656, Kohno O. et al, "Critical Current Density of Y-Ba-Cu Oxide Wires".

Japanese Journal of Applied Physics, vol. 26, No. 5 (1987) pp. L759–L760, Kohno, O. et al, "Critical Temperature and Critical Current Density of La-Sr-Cu Oxide Wires".

Japanese Journal of Applied Physics, Letters vol. 26, No. 5, May 1987, Tokyo JP pp. 706–708; T. Wada et al.: "Substitution effect of Sr for Ba of high-Tc superconducting YBa2Cu3O7-y ceramics" *p. 706.*

Physical Review Letters. vol. 58, No. 18, May 4 1987, New York US pp. 1888–1890; D. W. Murphy et al.: "New superconducting cuprate perovskites" *p. 1888.*

Japanese Journal of Applied Physics, Letters vol. 26, No. 3, Mar. 1987, Tokyo JP pp. 223–224; Y. Saito et al.: "Composition dependence of the high temperature superconductivity in (Ba,Sr)-La-(Hg,Ag)-Cu O system with K2NiF4-type structure" *p. 223*.

Japanese Journal of Applied Physics, Letters vol. 26, No. 5 May 1987, Tokyo JP pp. 834–835; Y. Saito et al.: "Composition dependence of superconductivity in (Ba0,1La1,9)AgxCu1-xO4-y system" *p. 834*.

Physical Review Letters. vol. 58, No. 24, Jun. 15, 1987, New York U.S. pp. 2579–2581; S. R. Ovshinsky et al.: "Superconductivity at 155 K" *p. 2579*.

Physical Review, B. Condensed Matter. vol. 36, No. 13, Nov. 1, 1987, New York U.S. pp. 7197–7198; T. J. Kistenmacher: "Structural basis for enhanced Tc in YBa2Cu3OyFx" *the whole document*.

Japanese Journal of Applied Physics, Letters vol. 26, No. 4 Apr. 1987, Tokyo JP pp. 337–338; T. Hasegawa et al.: "High Tc superconductivity of (La1-xSrx) 2CuO4—Effect of substitution of foreign ions for Cu and La on super-conductivity"

Japanese Journal of Applied Physics, Letters vol. 26, No. 5, May 1987, Tokyo JP pp. 694–696; K. Kishio et al.: "Superconducivity achieved at over liquid nitrogen temperature by (mixed rare earths)-Ba-Cu oxides" *p. 694*.

Japanese Journal of Applied Physics, Letters vol. 26, No. 5, May 1987, Tokyo JP pp. 704–705; S. Tsurimi et al.: "High-Tc superconductivities of (Y1-xYBx)2Ba4Cu6O14+y(0<y<2,5)" *p. 704*.

SUBSTITUTED YIBA$_2$CU$_3$ OXIDE SUPERCONDUCTOR

This application is a continuation of application Ser. No. 178,223, filed on Apr. 6, 1988, now abandoned.

BACKGROUND OF THE INVENTION

The present invention relates to a superconductor manufacturing method and a superconductor manufactured by the method and, more particularly, to an oxide superconductor of lamellar perovskite type and a manufacturing method of the same having extremely high critical temperature and critical current density as compared with conventional alloy superconductors or intermetallic compound superconductors.

In recent years, superconducting materials having superconducting characteristics in a temperature range equal to or above the liquid nitrogen temperature have been developed. These superconducting materials are considered to be applicable to various uses including Josephson devices, superconducting memory devices, superconducting quantum interference devices (SQUID), superconducting magnets, superconducting electric power transmission lines and superconducting power generators. It is desirable from the practical point of view that the superconductor has a critical current density as high as possible, as well as a critical temperature as high as possible.

The currently available oxide superconductors include A-B-Cu-O materials wherein A represents one of elements of the group IIIa in the periodic table such as Sc, Y, La and the like, and B represents one of elements of the group IIa in the periodic table such as Be, Sr, Ba and the like. For example, the A-B-Cu-O materials include an La-Sr-Cu-O material or a Y-Ba-Cu-O material. In these superconducting materials, A is a single element selected from the group IIIa in the periodic table, and B is a single element selected from the group IIa in the periodic table.

SUMMARY OF THE INVENTION

It is an object of the invention to provide a method of obtaining a superconductor having a high critical temperature and a high critical current density, and to provide a superconductor having such characteristics.

According to the invention, there is provided a superconductor which is obtained in such a manner that raw material powder resulting from mixing of powders of compounds of respective elements constituting the superconductor, or superconducting raw material resulting from calcination treatment of the raw material powder is heating-treated, and the heating-treated raw material powder or superconducting raw material is sintered. The superconductor is an oxide superconductor expressed by A-B-Cu-O wherein A represents at least one of elements of the group IIIa in the periodic table such as Y, Sc, La, Ce and the like, and B represents at least one of elements of the group IIa in the periodic table such as Ba, Sr and the like, and wherein at least one of A and B consists of two or more elements of the same group. Either one or both of Cu and O atoms include 3 atomic percent or more of at least one element of the group Ib in the periodic table and 50 atomic percent or less of at least one element of the group VIIb in the periodic table.

A method of manufacturing the superconductor will be outlined below.

Formation of Superconducting Raw Material

The above-mentioned raw material powder is obtained by mixing, at a predetermined ratio, several kinds of powders of compounds of respective elements constituting the superconductor. The compounds to be mixed with each other include at least one of elements of the group IIIa in the periodic table such as, for example, Sc, Y, La, Ce, Pr, Nd, Pm, Sm, Eu, Gd, Tb, Dy, Ho, Er, Tm, Yb, Lu and the like, at least one of elements of the group IIa in the periodic table such as, for example, Be, Sr, Mg, Ba, Ra and the like, and an oxide of copper. Preferably, used as the compounds of these elements are powders of oxides of the above-mentioned group IIIa elements such as, for example, scandium oxide, yttrium oxide, lanthanum oxide and the like, and powders of carbonates of the group IIa elements such as, for example, barium carbonate, strontium carbonate and the like. In mixing the powders, the compounds are mixed with each other such that a plurality of homologous elements are contained from at least one of the group IIIa and the group IIa. The compound of Cu may include 50 or less atomic percent of compounds of the elements of the group Ib in the periodic table.

Although the superconductor can be obtained by directly burning the raw material powder, the superconductor may be obtained in such a manner that the following steps are carried into effect with respect to the raw material powder to obtain a superconductor raw material and, subsequently, the superconductor raw material is sintered. That is, the above-mentioned mixed powder is pressure-formed to manufacture a compact, the compact is further subjected to a heat treatment to transform a part of the compact into a superconductor, and the compact is then pulverized to obtain powder or superconducting raw material partially containing a superconductor. A pulverizing step and a compacting step may be added to the above-described steps. Accordingly, typical combinations of the steps for forming the superconducting raw material are as follows:

(1) only mixing of raw material powder;
(2) mixing and compacting of raw material powder;
(3) mixing, calcining and pulverizing of raw material powder; and
(4) mixing, calcining, pulverizing and compacting of raw material powder.

Heating Treatment

A heating treatment with respect to the raw material powder or superconducting raw material obtained by the above steps is carried into practice at a temperature in a range of from 800 to 1100 degrees C. for 1 to 300 hours within an oxygen atmosphere. By this step, there is provided an oxide superconductor of lamellar perovskite type having expected excellent superconducting characteristics.

If the heating treatment is carried into practice within an oxygen atmosphere containing halogen gas of more than 3% and less than 90%, preferably more than 5% and less than 50%, the halogen gas is substituted for a part of the oxygen atoms so that there can be provided a superconductor which is further high in critical temperature and critical current density.

The critical current density and the critical temperature are improved by substituting at least one element of the group Ib in the periodic table for a part of Cu atoms and by substituting at least one element of the group VIIb in the periodic table for a part of the that, in the perovskite crystal structure of the osygen atoms. It is presumed, the reason for the above is that, in the perovskite crystal structure of the oxide superconductor, a part of Cu or oxygen atoms is replaced by substitution elements different in ionic radius from each other. In order to make the substitution elements exist as a factor of lattice distortion, it is necessary that the substitution proportion of the Ib group element or elements and the VIIb group element or elements are either equal to or less than 50 atomic percent.

Since most elements of the group VIIb are gaseous in an operating temperature range, if these elements are used, the elements can be supplied at the heating treatment in such a state that the elements are mingled into an oxygen gas stream. In this case, only a single element of the group VIIb may be used, or a plurality of elements of the group VIIb may be used in a mixed fashion.

DETAILED DESCRIPTION

Preferred embodiments of a superconductor and a manufacturing method thereof according to the invention will be described below.

Powders of compounds of respective elements constituting a superconductor, that is, powder of a compound of at least one of elements of the group IIIa in the periodic table, powder of a compound of at least one of elements of the group IIa in the periodic table, and powder of a compound of copper are mixed with each other, to obtain raw material powder. The compound of the at least one element of the group IIIa used at this time includes an oxide of at least one of elements of the group IIIa such as Y, Ho, Sc, La, Ce, Yb, Dy, Ho, Er, Eu and the like, for example, such as scandium oxide, yttrium oxide, lanthanum oxide or the like. The compound of the at least one element of the group IIa includes a carbonate of at least one of elements of the group IIa such as B, Ba, Sr and the like, for example, powder of Barium carbonate, strontium carbonate, calcium carbonate, beryllium carbonate or the like. The oxide of copper is one expressed, for example, by $CuO$, $Cu_2O$, $Cu_2O_3$ or $Cu_3O_4$. At least one of the above-mentioned compound of the group IIIa and the compound of the group IIa includes compounds of two or more elements belonging to the same group. These powders are mixed with each other in such a manner that, assuming that an atomic ratio or a molar fraction among the elements of the group IIIa in the periodic table, the elements of the group IIa in the periodic table, and the copper is expressed by x:y:z, the ratio is brought to the following relationships:

$$0.1 \leq x \leq 2, 0.1 \leq y \leq 2, \text{ and } z = 1$$

where $x+y$ is equal to 2.

By mixing the powders in the manner as described above, there is provided an oxide superconductor expressed as follows:

$(0.1 \leq x 2, y = 2 - x, \text{ and } w = 4)$.

More particularly, for example, Y and Ho are selected as the elements of the group IIIa in the periodic table,
Ba is selected as the element of the group IIa in the periodic table, and these selected elements and Cu are mixed with each other such that the atomic ratio $Y+Ho:Ba:Cu$ becomes equal to 1:2:3.

In this mixing, a plurality of kinds of compounds of the respective elements belonging respectively to the group IIIa and the group IIa may be mixed with each other, provided that the ratio in number of atoms among the group IIIa elements, the group IIa elements and copper takes the above-mentioned value. Mixing of the raw material powder may also be effected by means of the known coprecipitation method or sol-gel method.

Moreover, the aforesaid powder of copper oxide may contain a compound of an element of the group Ib in the periodic table such as, for example, a compound containing powder of silver oxide in a range of from 5% to 20%. In this case, the sum of the number of copper atoms and and the number of silver atoms should preferably be a value similar to the number of atoms of the aforesaid copper.

Subsequently, the raw material powder is subjected to a calcination treatment in accordance with the following procedure, to partially form a superconducting material. That is, such a treatment that the raw material powder is heated at 500 to 950 degrees C. for something like 1 to 100 hours and, subsequently, is cooled, is repeated usually a plurality of times. If the raw material powder contains extraneous or unnecessary components such as carbon and the like, the calcination treatment has also such an effect as to thermally decompose the unnecessary components.

By the steps described above, a superconducting material having the following constitution is partially formed in the raw material powder after having been calcined:

where
A represents at least one of the elements of the group IIIa in the periodic table such as Y, Sc, La, Ce and the like,
B represents at least one of the element of the group IIa in the periodic table such as Ba, Sr or the like, and
w, x, y and z represent their respective molar fraction.

Further, the raw material powder is sufficiently pulverized to a particle size on the order of 1 μm, and the particle size of the raw material powder is made uniform. Subsequently, the raw material powder is pressure-formed by means of a rubber press or the like to obtain a compact.

Subsequently, the compact is heated at a temperature in a range of from 800 to 1100 degrees C. for 1 to 300 hours within the oxygen atmosphere or within the oxygen gas stream. This heating treatment causes the elements to react with each other so that the forming density of the oxide superconducting material of perovskite type is further improved. Thus, a superconductor is obtained.

Subsequently, the above-mentioned superconductor is pulverized to obtain powder thereof on the order of 1 μm in particle size, that is, to obtain raw material powder.

In the above-mentioned step of mixing powders of the compounds of the respective elements constituting the aforesaid superconductor with each other, if powder of $Y_2O_3$ and powder of $Ho_2O_3$ are selected as compounds of elements of the group IIIa in the periodic table, if powder of $BaCO_3$ and powder of $SrCO_3$ are selected as compounds of elements of the group IIa in the periodic table, if the powder of CuO is used which partially contains powder of AgO, and if the calcination treatment is effected within an oxide and fluorine atmosphere, raw material powder partially having a superconducting material having the following constitution is obtained:

$$(Y_w, Ho_{1-w})_1 (Ba_x, Sr_{x-1})_2 (Cu_y, Ag_{y-1})_3 (O_z, F_{1-z})_{4-\delta}$$

where w, x, y and z satisfy the relationships of $$0.1<w<0.9, 0.1<x<0.9,$$

$$0.1<y<0.9 \text{ and } 0.1<z<0.9.$$

The same steps as those described above are applied to the raw material powder. That is, the raw material powder after having been calcined is pulverized and is formed into a compact; thereafter, a heating treatment similar to that described above or similar to the calcination treatment is applied to the compact to improve the forming density of the superconducting material; and the compact is again pulverized to obtain raw material powder. The oxide of silver which is partially mingled with the oxide of copper may further contain gold. In addition, gold may be used in substitution for the copper.

It is possible for the above-described superconductor manufacturing method according to the invention to obtain a superconductor having excellent superconducting characteristics. Further, the superconductor according to the invention is high in critical current density. Moreover, the superconductor according to the invention shows superconducting characteristics up to a relatively high temperature range.

EXAMPLE 1

Powder of barium carbonate, powder of lanthanum carbonate, powder of ytterbium oxide and powder of copper oxide were first prepared as raw material powder. These powders were then mixed with each other such that a ratio in number of atoms among the respective elements was brought to the following element constitution and, subsequently, the powders were sintered at a temperature of 950 degrees C. for 12 hours, to manufacture a compact in the form of a block. Critical temperature (Tc) of the compact was measured. The measurement revealed the following results:

$(Ba_{0.15}La_{1.50}Yb_{0.35}CuOx) \ldots Tc=39K$ where x is equal to 4.

EXAMPLE 2

Powder of barium carbonate, powder of strontium carbonate, powder of lanthanum oxide and powder of copper oxide were prepared as raw material powder. These powders were then mixed with each other such that a ratio in number of atoms among the respective elements was brought to the following element constitution and, subsequently, the powders were sintered at 950 degrees C for 12 hours to manufacture a compact in the form of a block. Critical temperature (Tc) of the compact was measured. The measurement revealed the following results:

$(Ba_{0.1}Sr_{0.05}La_{1.85}CuOx) \ldots Tc=38K$ where x is equal to 4.

EXAMPLE 3

Powder of barium carbonate, powder of strontium carbonate, powder of lanthanum oxide, powder of ytterbium oxide and powder of copper oxide were prepared as raw material powder. These powders were then mixed with each other such that a ratio in number of atoms among the respective elements was brought to the following element constitution and, subsequently, the powders were sintered at 950 degrees C for 12 hours to manufacture a compact in the form of a block. Critical temperature (Tc) of the compact was measured. The measurement revealed the following results:

$(Ba_{0.1}Sr_{0.05}La_{1.5}Yb_{0.35}CuOx) \ldots Tc=40K$ where x is equal to 4.

EXAMPLE 4

$Y_2O_3$ and $Yb_2O_3$ were used as compounds of elements of the group IIIa in the periodic table, and were mixed with each other such that a ratio in number of atoms between Y and Yb was brought to 9:1. $BaCO_3$ and $SrCO_3$ were used as compounds of elements of the group IIa in the periodic table and were mixed with each other such that a ratio in number of atoms between Ba and Sr was brought to 17:3. CuO was further mixed with these mixtures to prepare such raw material powder as to have a composition ratio of $(Y_{0.9}Yb_{0.1})(Ba_{1.7}Sr_{0.3})Cu_3$.

The raw material powder was then calcined at 900 degrees C. for 24 hours within the atmosphere and, subsequently, was formed by a rubber press into a compact in the form of a bar. The compact was sintered at 900 degrees C. for 5 hours within a stream of gas containing 90% of oxygen and 10% of fluorine gas.

The sintered compact was then filled into a tube formed of silver having an outer diameter of 10 mm and an inner diameter of 6 mm. The silver tube filled with the sintered compact was drawn until the outer diameter of the silver tube was reduced to 1.0 mm. Subsequently, the silver tube was sintered at 900 degrees C. for 15 hours within an oxygen and fluorine mixture gas similar to that described above, to manufacture a wirelike semiconductor.

Critical temperature (Tc) and critical current density (Jc) of the thus completed superconductor were measured by a four-terminal method. The measurement revealed that superconductivity initiating temperature was 110K, zero resistance temperature was 95K, and a mid point was 102.5K. Concerning the critical current density, such a measurement value was obtained that Jc was equal to 1050 A/cm$^2$. These can be said to be extremely excellent superconducting characteristics.

EXAMPLE 5

As compounds of elements of the group IIIa in the periodic table, $Y_2O_3$ and $Ho_2O_3$ were used and were mixed with each other such that a ratio in number of atoms between Y and Ho was brought to 8:2. As compounds of elements of the group IIa in the periodic table, $BaCO_3$ and $SrCO_3$ were used and were mixed with each other such that a ratio in number of atoms between Ba and Sr was brought to 85:15. Further, powder of CuO and powder of AgO were mixed with each other such that a ratio in number of atoms between Cu and Ag was brought to 9:1. The above-mentioned mixture powders were further mixed with each other to prepare such raw material powder as to have a composition ratio of $(Y_{0.8}Ho_{0.2})(Ba_{1.7}Sr_{0.3})(Cu_{2.7}Ag_{0.3})$.

The raw material powder was then calcined at 900 degrees C. for 15 hours within a mixture gas stream in which a molar ratio between oxygen gas and fluorine gas was 8:2. Subsequently, the raw material powder was compression-formed into compacts in the form of a pellet. Further, the compacts were sintered at 900 degrees C. for 24 hours within a stream of oxygen gas and fluorine gas similar to that described above.

The sintered compacts were then filled into a tube formed of silver having an outer diameter of 10 mm and an inner diameter of 6 mm. The tube filled with the sintered compacts was drawn until the outer diameter of the tube was reduced to 1.0 mm and was sintered at 900 degrees C. for 15 hours within a mixture stream of oxygen gas and fluorine gas similar to that described above.

Critical temperature (Tc) and critical current density (Jc) of a superconductor completed in the manner as described above were measured by a four-terminal method. The measurement revealed that superconductivity initiating temperature was 120K and zero resistance temperature was 109K. The critical current density was measured with respect to a pellet in the form of a rectangular parallelopiped having a width of 8 mm, a thickness of 2 mm and a length of 20 mm. Such a measurement value was obtained that Jc was equal to 2000 A/cm² at the liquid nitrogen temperature. These can be said to be extremely excellent superconducting characteristics.

EXAMPLE 6

As compounds of elements of the group IIIa in the periodic table, $Y_2O_3$ and $Er_2O_3$ were used and were mixed with each other such that a ratio in number of atoms between Y and Er was brought to 9:1. As compounds of elements of the group IIa in the periodic table, $BaCO_3$ and $CaCO_3$ were used and were mixed with each other such that a ratio in number of atoms between Ba and Ca was brought to 9:1. Further, CuO and AuO were mixed with each other such that a ratio in number of atoms between Cu and Ag was brought to 9:1. These mixture powders were further mixed with each other to prepare such raw material powder as to have a composition ratio of $(Y_{0.9}Er_{0.1})(Ba_{1.8}Ca_{0.2})(Cu_{0.7}Au_{0.3})$.

The raw material powder was then calcined at 950 degrees C. within a mixture gas stream in which a molar ratio between oxygen and bromine is 9:1. Subsequently, the raw material powder was formed by a rubber press into a compact in the form of a bar having a diameter of 5 mm. The compact was further sintered at 900 degrees C. for 10 hours within a gas stream similar to the above-mentioned mixture gas.

The bar-like compact was filled into a tube formed of silver having an outer diameter of 10 mm and an inner diameter of 6 mm. The tube filled with the bar-like compact was drawn until the diameter of the tube was reduced to 1.5 mm. The drawn tube was heated at 900 degrees C. for 24 hours within a gas stream similar to the above-mentioned mixture gas stream, to obtain an oxide superconductor.

Critical temperature (Tc) and critical current density (Jc) of the thus completed superconductor were measured by a four-terminal method. The measurement revealed such excellent superconducting characteristics that superconductivity initiating temperature was 122K, zero resistance temperature was 96K, and a mid point was 109K. In addition, the critical current density recorded 1200 A/cm² at the liquid nitrogen temperature.

What is claimed is:

1. A superconductor composition represented by the formula:

$$A_2\text{-}B_1\text{-}Cu_3\text{-}D_{7-\delta}$$

wherein
the numerals represent molar fractions and the symbol $\delta$ is a number representing a deficiency of oxygen;
A represents Ba having a substitutional element selected from the group consisting of Sr and Ca;
B represents Y having a substitutional element selected from the group consisting of Yb, Ho and Er; and
D represents O having a substitutional element selected from the group consisting of F and Br.

2. A superconductor composition represented by the formula:

$$A_2\text{-}B_1\text{-}C_3\text{-}D_{7-\delta}$$

wherein
the numerals represent molar fractions and the symbol $\delta$ is a number representing a deficiency of oxygen;
A represents Ba having a substitutional element selected from the group consisting of Sr and Ca;
B represents Y having a substitutional element selected from the group consisting of Yb, Ho and Er;
C represents Cu having a substitutional element selected from the group consisting of Ag and Au; and
D represents O having a substitutional element selected from the group consisting of F and Br.

3. A superconductor composition represented by the formula:

$$(Ba_{1.7}Sr_{0.3})(Y_{0.9}Yb_{0.1})(Cu_{3.0})(O+F)_{7-\delta}.$$

4. A superconductor composition represented by the formula:

$$(Ba_{1.7}Sr_{0.3})(Y_{0.8}Ho_{0.2})(Cu_{2.7}Ag_{0.3})(O+F)_{7-\delta}.$$

5. A superconductor composition represented by the formula:

$$(Ba_{1.8}Sr_{0.2})(Y_{0.9}Er_{0.1})(Cu_{2.7}Ag_{0.3})(O+Br)_{7-\delta}.$$

* * * * *

UNITED STATES PATENT AND TRADEMARK OFFICE
CERTIFICATE OF CORRECTION

PATENT NO. : 5,108,986
DATED : April 28, 1992
INVENTOR(S) : Osamu Kohno et al It is certified that error appears in the above-identified patent and that said Letters Patent is hereby corrected as shown below:

Column 8, line 19, change "$A_2-B_1-Cu_3-D_{7-67}$" to $A_2-B_1-Cu_3-D_{7-\delta}$--.

Signed and Sealed this

Sixth Day of July, 1993

Attest:

MICHAEL K. KIRK

Attesting Officer      Acting Commissioner of Patents and Trademarks